United States Patent [19]
Capone et al.

[11] Patent Number: 5,356,869
[45] Date of Patent: * Oct. 18, 1994

[54] METAL OXIDE SUPERCONDUCTING POWDER COMPRISED OF FLAKE-LIKE SINGLE CRYSTAL PARTICLES

[75] Inventors: Donald W. Capone, Bolingbrook; Joseph Dusek, Downers Grove, both of Ill.

[73] Assignee: Arch Development Corporation, Chicago, Ill.

[*] Notice: The portion of the term of this patent subsequent to Oct. 1, 2008 has been disclaimed.

[21] Appl. No.: 629,089

[22] Filed: Dec. 17, 1990

Related U.S. Application Data

[63] Continuation of Ser. No. 101,771, Sep. 28, 1987, abandoned.

[51] Int. Cl.$^5$ .................. C01G 3/02; H01L 39/24
[52] U.S. Cl. .................. 505/430; 505/715; 505/729; 505/739; 505/490
[58] Field of Search .............. 505/823, 725, 729, 739, 505/1; 501/1; 252/518, 521

[56] References Cited

U.S. PATENT DOCUMENTS

| | | | |
|---|---|---|---|
| 3,290,186 | 12/1966 | Rosi et al. | 505/823 |
| 4,612,296 | 8/1985 | Sakamoto et al. | 264/125 |
| 4,640,816 | 2/1987 | Atzmon et al. | 508/823 |
| 4,942,151 | 7/1990 | Capone | 264/63 |
| 4,973,575 | 11/1990 | Capone | 264/108 |
| 5,045,528 | 9/1991 | Tolt | 505/1 |
| 5,053,385 | 10/1991 | Capone | 264/24 |

OTHER PUBLICATIONS

Ono "Preparation of Single Crystals of the Superconductor $Ba_2YCu_3O_{6.5xy}$" *Jap. Jnl. Appl. Phys.* vol. 26(5) May 1987 pp. L825–L827.
Bordet "Crystal Structure of $Y_{0.9}Ba_{2.1}Cu_7O_6$, A Compound . . . " *Nature* vol. 327 Jun. 23, 1987 pp. 687–689.
Hidaka "Anisotrophy of the Upper Critical Magnetic Field . . . " *Jap. Jnl. Appld. Physics* vol. 26(5) May 1987 pp. L726–L728.
*Ceramic Processing* Prepared by the Committee on Ceramic Processing, National Research Council, 1968 no month available.
Sueno "A Single Crystal High Temperature X-ray Study. . . . " *Jap. Jnl. Appl. Phys.* vol. 26(5) May 1987 pp. L842–L844.
Hayashi "Preparation and Characterization of Ba–Y–Cu–O Single Crystals" *Jap. Jnl. Appl. Phys.* vol. 26(7) Jul. 1987 pp. L1240–L1243.
Oda "Oxygen Deficiency in $YM_2Cu_3O_{7xy}$ (M=Ba,Sr) Family" *Jap. Jnl. Appl. Phys.* vol. 26(5) May 1987 pp. L804–806.
Nakai "X-ray Single Crystal Structure Analysis of Tetragonil . . . " *Jap. Jnl. Appl. Phys.* vol. 26(5) May 1987 pp. L788–L790.
Clarke, "The Development of High Tc Ceramic Superconductors . . . " *Advanced Cer. Materials* vol. 2(3B) Jul. 1987 pp. 273–292.
Qadri "X-ray Identification of the Superconducting High-Tc Phase . . . " *Physical Rev. B* vol. 35 No. 13 May 1, 1987 pp. 7235–7237.
Nishihara "Preparation of High Tc Superconducting $(La_{1-x}Sr_x)_2CuO_4$" *Jap. Jnl. Applid. Phys.* vol. 26(5) May 1987 pp. L606–L607.

(List continued on next page.)

*Primary Examiner*—Paul Lieberman
*Assistant Examiner*—John Boyd
*Attorney, Agent, or Firm*—Reinhart, Boerner, Van Deuren, Norris & Rieselbach

[57] ABSTRACT

Powder of a ceramic superconducting material is synthesized such that each particle of the powder is a single crystal having a flake-like, nonsymmetric morphology such that the c-axis is aligned parallel to the short dimension of the flake. Nonflake powder is synthesized by the normal methods and is pressed into pellets or other shapes and fired for excessive times to produce a coarse grained structure. The fired products are then crushed and ground producing the flake-like powder particles which exhibit superconducting characteristics when aligned with the crystal lattice.

5 Claims, 1 Drawing Sheet

OTHER PUBLICATIONS

Liu "Superconductivity and Structure of Single Crystal $YBa_2Cu_3O_x$" *Physic Letters A* vol. 121(6) May 4, 1987 pp. 305–306.

Moodenbaugh et al. "Superconductivity Near 90K in the LuBaCuO System" *Phy. Rev. Ctrs.* v. 58 N 18 4 May 1987.

Semba et al. "Novel High-Tc Superconducting Phase of the YBaCuO Compound" *Jap. J. of App. Phy.* v26 N4 Apr. 1987, pp. L429–L431.

Schneemyer et al., "Superconducting in $YBa_2Cu_3O_{7-x}$ Single Crystals" 328 *Nature* pp. 601–602 13 Aug. 1987.

Calestani et al. "Crystal Structure of the $YBa_2Cu_3O_{7-x}$ Superconductor by Single-Crystal X-ray Diffraction" 328 *Nature* pp. 606–607, 13 Aug. 1987.

Dinger et al. "Direct Observation of Electronic Anisotropy in Single-Crystal $YBa_2Cu_3O_{7-x}$" *Physical Rev. Ltrs.* vol. 58 No. 25, pp. 2687–2690, 22 Jun. 1987.

Akimitsu et al. "High Tc Superconductivity in YBaCuO System" Jap J. App. Phy. v. 26 N. 4, Apr. 1987, pp. L449–L451.

Johnson, D. W. Jr. et al.: "Fabricaiton of . . . Oxides", *High Temperature Superconductors*, Proc. 1987 Spring Meeting of Mat. Res. Soc., pp. 193–195, Apr. 23–24 1987.

Poeppel, R. B. et al.: "Fabrication . . . Ceramics", ACS Symposium Series 351, pp. 261–265, Aug. 30–Sep. 4, 1987.

METAL OXIDE SUPERCONDUCTING POWDER COMPRISED OF FLAKE-LIKE SINGLE CRYSTAL PARTICLES

CONTRACTUAL ORIGIN OF THE INVENTION

This invention was made with Government support under Contract Number W-31-109-ENG-38 awarded by the United States Department of Energy. The Government has certain rights in the invention.

This is a continuation of application Ser. No. 101,771, filed Sep. 28, 1987, now abandoned.

CROSS-REFERENCE TO RELATED APPLICATIONS

This application is related to but in no way dependent upon the following applications, all of which are assigned to the assignee of the present application: Ser. No. 101,818, filed Sep. 28, 1987; Ser. No. 101,819, filed Sep. 28, 1987; Ser. No. 101,820, filed Sep. 28, 1987; and Ser. No. 101,821, filed Sep. 28, 1987.

BACKGROUND OF THE INVENTION

This invention relates generally to the synthesis of a ceramic superconducting material and is particularly directed to a metal oxide powder comprised of flake-like, single crystal particles for use as a superconductor.

Certain metals, alloys, and chemical compounds known as superconductors exhibit zero electrical resistivity and complete diamagnetism at very low temperatures and magnetic fields. The transition of a metal from normal electrical conducting properties to superconducting properties depends primarily on (1) the temperature and (2) the magnetic field at the surface of the metal. The superconductive state of the metal exists for temperatures less than its characteristic critical temperature, $T_c$. The most practial superconducting materials exhibit very low critical temperatures, i.e., on the order of 4–23 K. However, recent developments have produced new superconducting materials, based on oxides, having critical temperatures on the order of 100 K.

Superconductors also exhibit a characteristic critical electric current density, $J_c$, measured in amps/cm$^2$. By increasing the current density in a superconducting material to its $J_c$ characteristic value, it can be driven into a normal conducting state. Thus, the current density at which this transition occurs is termed the conductive material's critical current density. It is of course desirable for a superconductor to have a high critical current density to allow it to conduct large currents while remaining superconductive.

In practical Type II superconductors efforts to increase the critical current density have involved the incorporation of microstructural defects in the material. A magnetic field applied to the superconductor penetrates the material in the form of small bundles, or vortices, of magnetic flux which can move about within the material as it conducts current. Movement of these magnetic vortices is a dissipative process characterized by resistive heating and thus represents a limitation in the material's current carrying capacity. Incorporation of the aforementioned microstructural defects within the material prevents the magnetic vortices from moving within the superconductor in response to current flowing therein. By preventing the movement of these magnetic vortices, the material's critical current density can be substantially increased before the material assumes normal, non-superconducting current conducting operation.

The class of metal oxide superconductors unfortunately exhibit very small critical current densities. For example, these materials typically have a critical current density in the presence of magnetic fields on the order of 5–10 amps/cm$^2$, while other practical superconductors typically are capable of supporting current densities on the order of 10,000–100,000 amps/cm$^2$. As a result, these metal oxide materials have heretofore been of limited use in superconducting applications. Recent investigations have indicated that low critical electric current density values are not an intrinsic problem with metal oxide superconductors, since single crystal, thin film metal oxide superconducting materials have been produced which are capable of supporting very large current densities.

The present invention overcomes the aforementioned limitations of the prior art by providing a metal oxide superconducting powder comprised of flake-like, single crystal particles which are aligned with the crystal lattice for substantially enhancing the current carrying capacity of the superconducting material.

OBJECTS AND SUMMARY OF THE INVENTION

Accordingly, it is an object of the present invention to provide a ceramic superconducting material comprised of individual crystals having a flake-like morphology.

Another object of the present invention is to provide a polycrystalline oxide superconducting material in the form of a powder comprised of individual crystals which are non-cubic and electrically anisotropic and are oriented in common alignment to enhance current-carrying capacity.

Yet another object of the present invention is to provide a ceramic superconducting material in the form of a powder comprised of single crystals having a flake-like morphology such that the c-axis is aligned parallel to the short dimension of the flake.

Accordingly, the present invention contemplates the synthesis of a powder of ceramic superconducting material in which each particle of the powder is a single crystal and has a flake-like morphology such that the c-axis is aligned parallel to the short dimension of the flake. A nonflake powder is first synthesized by conventional methods and is then pressed into pellets or other shapes and fired for an extended period to produce a coarse grained structure. The fired products are then crushed and ground so as to produce a powder of single crystals having a flake-like morphology and which, after further processing into tapes and/or wires, is capable of accommodating large current densities.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various Figures, in which:

DESCRIPTION OF THE PREFERRED EMBODIMENT

Figure 1:
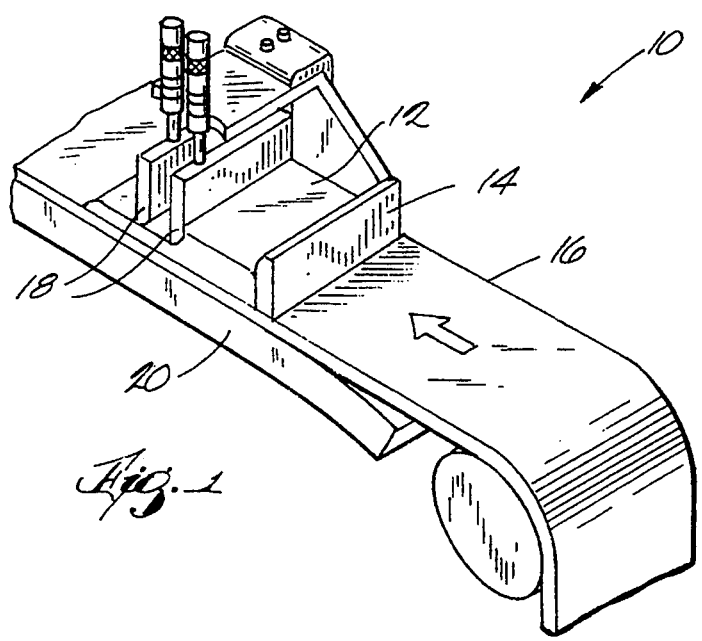
FIG. 1 is a simplified schematic diagram of a tape casting apparatus for use in the preferential orientation of the crystal particles of a metal oxide superconducting material in accordance with the present invention.

Initial measurements on polycrystalline samples of oxide superconductors such as $YBa_2Cu_3O_{7-X}$ (where $0<X<0.5$) have shown that the current carrying capacity of these materials is not large enough to allow these materials to serve in practical applications. For example, recent measurements have indicated that these materials are only capable of supporting current densities on the order of 100–1000 amps/cm$^2$ in zero magnetic field. This current carrying capacity is clearly inadequate from a practical standpoint when compared with critical current densities on the order of 10,000–100,000 amps/cm$^2$ generally available in other superconducting materials. In addition, these limited current densities observed in metal oxide superconductors of this type are substantially reduced (as much as 100 times less) by the application of relatively small magnetic fields. Recent work performed at International Business Machines (IBM) as described at the American Ceramic Society Meeting in Pittsburgh, Pa., in April 1987 indicates that this is not an intrinsic problem with these metal oxide superconducting materials, since textured, thin-film materials have been produced which are capable of supporting very large current densities (>100,000 amps/cm$^2$). The aforementioned IBM work further indicates that the a- and b-directions, i.e., within the basal plane, of the orthorhombic $YBa_2Cu_3O_{7-X}$ are capable of supporting on the order of 30–100 times the critical current density which can be achieved in the c-direction, i.e., normal to the basal plane.

The reason for this inability of bulk metal oxide superconductors to support the large current densities necessary in virtually all practical applications appears to be a lack of alignment between adjacent grains of $YBa_2Cu_3O_{7-X}$ which carry the current in the superconducting state. This lack of alignment between adjacent grains is believed to restrict current transport to that available only by means of Josephson tunnelling and thus represents a severe limitation on current handling capability in magnetic fields. Evidence to support this finding can be found in both the small current densities and the strong field dependence of the conductivity of these materials.

This problem is avoided in the present invention by orienting the crystalline axes of different grains of these metal oxide superconducting materials along common directions to facilitate current transport across these grain boundaries. Polycrystalline oxide superconductors in accordance with the present invention are comprised of particles each of which is essentially a single crystal and which may be synthesized by either (1) growing bulk single crystals and grinding these single crystals into a powder, or (2) carrying out long-term annealing of powder samples of these polycrystalline metal oxide materials at temperatures near the melting temperature in order to promote large single crystal grain growth, followed by the grinding of these materials into fine powders.

In one approach leading to the present invention, a metal oxide superconductor such as $YBa_2Cu_3O_{7-X}$ (where $0<X<0.5$) is provided in powder form using any one of several conventional methods well known to those skilled in the relevant arts. This polycrystalline powder is then pressed into a compact form as a coherent mass such as in the shape of pellets by means of a hydrostatic press in a conventional manner. The compacted polycrystalline powder is then heated to a temperature on the order of its melting point, i.e., to a temperature in the range of 950°–1000° C. for yttrium barium copper oxide which has a melting point of approximately 1025° C. The metal oxide material is sintered at these high temperatures for an extended period of time, e.g., on the order of 20–60 hours, in order to induce large grain growth. After sintering the metal oxide material at the aforementioned temperatures for the stated period of time, grains on the order of 100 microns in diameter are produced in the compacted crystal structure.

The sintered, large grained metal oxide crystal structure is then ground to a powder comprised of single crystal particles. The thus formed superconducting powder has a flake-like morphology such that the c-axis of the individual crystals is aligned parallel to the short dimension of the disc-like flake. The metal oxide particles thus take on the general form of a flattened disc where the a- and b-directions arc in the plane of the disc and the c-axis is oriented generally perpendicular to the plane of the disc. All of the crystal particles thus have generally the same orientation. Tapes and/or wires processed from these powders have the a- and b-directions of the crystal particles oriented along the planes of the Cu and O conducting layers throughout the bulk of the wire or tape and thus permit a large critical current to be conducted within the conductor. In grinding the superconducting crystals down to a size much less than the original grain size, the compact superconducting metal oxide material is cleaved along the crystal axes resulting in platelets, or small flat bodies having the aforementioned disc-like shape. The high critical current density axes of these platelets lies in the plane of its disc-like shape.

In order to improve grain growth, impurities may be added to the metal oxide crystal material to produce larger grained structures. The addition of barium cuprate ($BaCuO_2$) to the metal oxide crystal material provides an excess of barium oxide and copper oxide, which form a low temperature eutectic with a melting temperature of about 880° C. lower than the sintering temperatures used. The low melting points of the barium oxide and copper oxide eutectic allow for increased diffusion within the metal oxide powder mixture producing larger grain growth. The other approach referred to above in producing the metal oxide crystal powder, i.e., growing bulk single crystals and grinding them into a powder, may be accomplished by growing each crystal from a similar melt using a molten bath. The difference between the two techniques lies in the amount of second phases one wishes to tolerate. In the molten bath technique large amounts of second phase must be removed from the mixture in order to obtain the desired $YBa_2Cu_3O_{7-X}$ crystals.

After producing the metal oxide crystal powders in which the particles are predominantly single crystallites, various approaches may be taken to orient the crystal particles along common axes. For example, as shown in FIG. 1, a tape casting apparatus 10 may be used in aligning the crystal particles along common axes. In the tape casting apparatus 10, a slip 12, comprised of a suitable mixture of single crystal powder, binders and plasticizers, is spread onto a tempered glass bed or other suitable flat surface 20 with a doctor blade 18 which produces the desired thickness. As the slip is drawn beneath the doctor blade 18, the individual crystal particles contained within are oriented such that their c-axes are aligned generally perpendicular with the plane of the tape. This is due to the flake-like discs aligning parallel to the plane of the tape.

Figure 2:
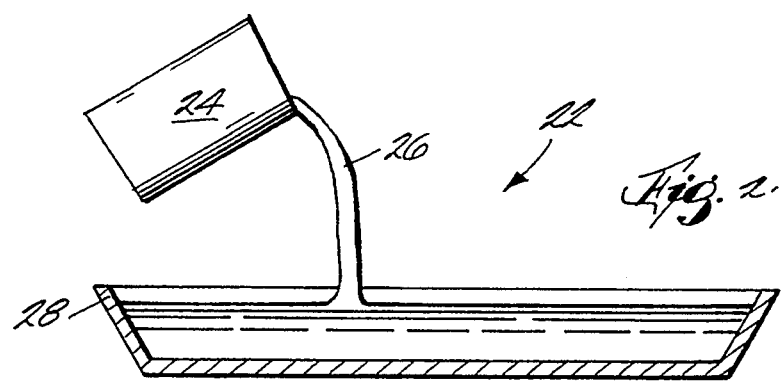
FIG. 2 is a simplified schematic diagram of a slip casting apparatus for use in the preferential orientation of the crystal particles of a metal oxide superconducting material in accordance with the present invention.

Referring to FIG. 2, there is shown another alternative approach which can be used for the preferential orientation of the individual crystal particles of the metal oxide powder. In the approach illustrated in FIG. 2, a slip casting arrangement 22 includes a plaster mold 28 into which a mixture 26 of the metal oxide powder crystals and a binder and solvent are poured from a container 24. The plaster mold 28 absorbs the binder and solvent leaving only the metal oxide crystals remaining in the plaster mold. Because of the plate-like shape of the individual crystals and their tendency not to remain in an on-end orientation, the crystal particles remaining in the plaster mold 28 are generally aligned in a flat orientation with their shorter c-axis aligned generally vertically.

Figure 3:
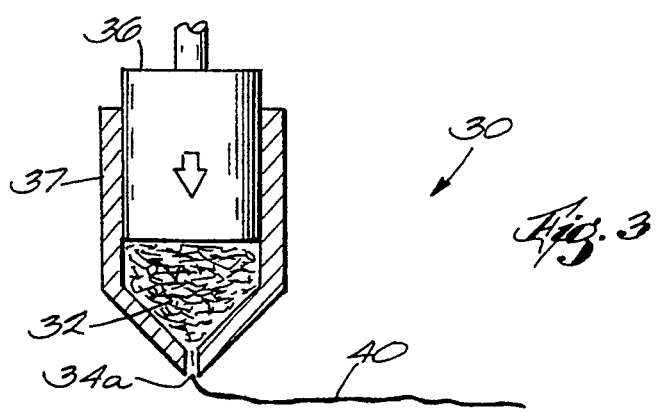
FIG. 3 is an extrusion arrangement for use in the preferential orientation of the crystal particles of a metal oxide superconducting material in accordance with the present invention.

Referring to FIG. 3, there is shown yet another arrangement for orienting the metal oxide crystals along a preferential axis. In the approach of FIG. 3, an extrusion apparatus 30 includes a container 34 within which a partially dried slip containing the metal oxide powder 32 having a putty-like texture is disposed. The container 34 includes a small tapered aperture 34a on a lower portion thereof. The downward displacement of a pusher element 36 against the slip 32 within the container 34 forces the mixture out of the container's aperture 34a. The thus extruded metal oxide powder is in the form of a wire 40. The physics producing alignment in the tape casting technique is the same in this technique and hence one can expect orientation using extrusion as well.

There has thus been shown an improved metal oxide superconducting material with enhanced current-carrying capability. The metal oxide material is comprised of a powder wherein each of the paticles is a single crystal having an orthorhombic structure and an anisotropic conductive characteristic. Each of the crystals is aligned along a preferential direction such that the desired direction of current conduction is aligned with the high critical current layers of the superconductor crystal structure. Various mechanical means may be used for the preferential orientation of the individual metal oxide crystals such as slip casting, tape casting, or extrusion.

While particular embodiments of the present invention have been shown and described, it will be obvious to those skilled in the art that changes and modifications may be made without departing from the invention in its broader aspects. For example, while the present invention is described in terms of a superconducting crystal powder comprised of yttrium barium copper oxide, this invention contemplates a superconducting material comprised of virtually any rare earth metal oxide having a crystal structure such as orthorhombic which possesses an anisotropic superconducting characteristic. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The embodiments of the invention in which an exclusive property or privilege is claimed are defined as follows:

1. A method for forming a superconducting metal oxide comprised of crystals having a nonsymmetric morphology and superconducting anisotropy, said method comprising the steps of:

providing a superconducting metal oxide material in the form of a polycrystalline powder;

pressing said polycrystalline powder into a coherent mass;

sintering said coherent mass by heating said coherent mass to a temperature on the order of its melting point for an extended period so as to cause the crystals of the superconducting metal oxide to grow to larger single crystal particles, said particles being on the order of X microns in diameter; and reducing said coherent mass to a powder comprised of predominantly flattened-discs with a- and b-crystallographic axes in a plane of each flattened disc and a c-axis perpendicular to each flattened disc, said flattened discs being smaller single crystal particles of said superconducting metal oxide, created by grinding the coherent mass down to particle sizes on the order of Y microns in diameter, where $Y<<X$, the grinding causing cleaving of each of said larger single crystal particles along planes of said a- and b-axes and wherein each of said flattened discs is superconducting in the plane of each of the discs and perpendicular to the c-axes thereof; and aligning the powders of said ground flattened discs to form said superconducting metal oxide into a mass of preferentially-oriented smaller single crystal particles with the c-axes of the particles positioned generally parallel.

2. The method of claim 1 wherein the step of pressing said polycrystalline powder into a coherent mass includes hydraulically compressing said polycrystalline powder.

3. The method of claim 1 wherein said superconducting metal oxide is a rare earth barium copper oxide, said method further comprising the step of adding a barium-copper metal oxide impurity having a lower melting point than the metal oxide crystals to the polycrystalline powder prior to pressing the polycrystalline powder to a coherent mass to enhance grain growth of the metal oxide crystals during subsequent sintering of said coherent mass, wherein said impurity is barium cuprate.

4. The method of claim 8 wherein said superconducting metal oxide is $YBa_2Cu_3O_{7-x}$, where $0<X<0.5$.

5. The method of claim 4 wherein the coherent mass of said $YBa_2Cu_3O_{7-x}$ is heated to a temperature of 950° C.–1000° C. for 50–60 hours during sintering.

* * * * *